(12) United States Patent
Baum et al.

(10) Patent No.: US 12,372,555 B2
(45) Date of Patent: Jul. 29, 2025

(54) CURRENT-SENSING RESISTOR

(71) Applicant: Isabellenhütte Heusler GmbH & Co. KG, Dillenburg (DE)

(72) Inventors: Andreas Baum, Bad Endbach (DE); Marcus Escher, Haiger (DE); Arno Fey, Dillenburg (DE); Wayne Lippert, Wetzlar (DE); Rainer Ostasch, Germering (DE)

(73) Assignee: ISABELLENHÜTTE HEUSLER GMBH & CO. KG, Dillenburg (DE)

( * ) Notice: Subject to any disclaimer, the term of this patent is extended or adjusted under 35 U.S.C. 154(b) by 110 days.

(21) Appl. No.: 18/272,010

(22) PCT Filed: Jan. 25, 2022

(86) PCT No.: PCT/EP2022/051560
§ 371 (c)(1),
(2) Date: Jul. 12, 2023

(87) PCT Pub. No.: WO2022/171427
PCT Pub. Date: Aug. 18, 2022

(65) Prior Publication Data
US 2024/0302412 A1    Sep. 12, 2024

(30) Foreign Application Priority Data

Feb. 11, 2021    (DE) ............... 10 2021 103 241.5

(51) Int. Cl.
*G01R 1/20*      (2006.01)
*G01R 15/14*     (2006.01)
*G01R 19/00*     (2006.01)

(52) U.S. Cl.
CPC ....... *G01R 15/146* (2013.01); *G01R 19/0092* (2013.01)

(58) Field of Classification Search
CPC ...... G01R 1/203; G01R 15/146; G01R 15/16; G01R 15/207; G01R 19/0092
See application file for complete search history.

(56) References Cited

U.S. PATENT DOCUMENTS

2011/0057764 A1    3/2011    Smith et al.
2017/0307658 A1*   10/2017   Chiku ................... G01R 15/14
(Continued)

FOREIGN PATENT DOCUMENTS

DE    20 2013 011 690 U1    2/2014
DE    10 2014 011 593 A1    2/2016
(Continued)

*Primary Examiner* — Thang X Le
(74) *Attorney, Agent, or Firm* — Grogan, Tuccillo & Vanderleeden LLP

(57) ABSTRACT

The invention relates to a resistor, in particular a low-resistance current-sensing resistor, with two connection parts made of a conductor material and a resistor element made of a resistor material. Furthermore, the resistor has two pairs of voltage measuring contacts for measuring the voltage dropping across the resistor element in two separate voltage measuring channels. The invention provides that the two pairs of voltage measuring contacts are arranged crosswise so that a connection line of the two voltage measuring contacts of the first pair of voltage measuring contacts intersects with a connection line of the two voltage measuring contacts of the second pair of voltage measuring contacts in a top view of the resistor.

21 Claims, 5 Drawing Sheets

(56) References Cited

U.S. PATENT DOCUMENTS

| | | |
|---|---|---|
| 2017/0307660 A1 | 10/2017 | Harvey et al. |
| 2020/0011899 A1* | 1/2020 | Tsukahara ................ H01C 7/06 |
| 2020/0200799 A1* | 6/2020 | Hung ....................... H01C 1/14 |
| 2020/0292588 A1* | 9/2020 | Mueller ............. G01R 19/0092 |
| 2022/0102032 A1* | 3/2022 | Ko ......................... H01C 1/012 |
| 2023/0168281 A1* | 6/2023 | Kramm ................. G01R 1/203 |
| | | 324/126 |

FOREIGN PATENT DOCUMENTS

| | | |
|---|---|---|
| DE | 11 2015 004 849 T5 | 7/2017 |
| DE | 10 2020 111 634 B3 | 4/2021 |
| EP | 0 605 800 A1 | 7/1994 |
| EP | 3 671 225 A1 | 6/2020 |
| WO | 2014/161624 A1 | 10/2014 |

* cited by examiner

CURRENT-SENSING RESISTOR

CROSS-REFERENCE TO RELATED APPLICATIONS

This application is a national stage of International Application No. PCT/EP2022/051560 filed on Jan. 25, 2022, which claims priority to German Patent Application No. 10 2021 103 241.5 filed Feb. 11, 2021, all of which is hereby incorporated by reference in its entirety.

TECHNICAL FIELD OF THE INVENTION

The invention relates to a resistor, in particular a low-resistance current-sensing resistor.

BACKGROUND OF THE INVENTION

It is known from the prior art (e.g. EP 0 605 800 A1) to measure electric currents according to the so-called four-wire technique by means of a low-resistance current-sensing resistor, which is also referred to as a "shunt". In this case, the electrical current to be measured is passed through the current-sensing resistor, whereby the voltage drop across a resistor element of the current-sensing resistor is measured. The measured voltage drop is then a measure of the electric current flowing through the current-sensing resistor in accordance with Ohm's law.

From WO 2014/161624 A1 such a current-sensing resistor is known, which has several pairs of voltage measuring contacts, which are arranged next to each other with respect to the current flow direction in the current-sensing resistor. The individual pairs of voltage measuring contacts each provide a voltage measurement value at different points of the resistor element. The individual voltage measurement values can then be averaged to increase the accuracy of the measurement. Here, the voltage measurement takes place parallel to the main current flow direction in the current-sensing resistor, since the pairs of voltage measuring contacts are not arranged crosswise, but in a straight line parallel to the longitudinal axis of the current-sensing resistor.

However, the disadvantage of this known current-sensing resistor is the non-optimal temperature coefficient, so that the measurement is temperature-dependent.

With regard to the technical background of the invention, reference should also be made to DE 10 2020 111 634 B3, EP 3 671 225 A1, US 2011/0057764 A1 and DE 11 2015 004 849 T5.

The invention is therefore based on the task of creating a correspondingly improved resistor.

This task is solved by a resistor according to the invention in accordance with the main claim.

In accordance with the known current-sensing resistor described at the beginning, the resistor according to the invention firstly has a first connection part which consists of an electrically conductive conductor material (e.g. copper) and serves to introduce the electric current to be measured into the resistor.

In addition, the resistor according to the invention also comprises, in accordance with the known current-sensing resistor described at the beginning, a second connection part which consists of an electrically conductive conductor material (e.g. copper) and serves to conduct the electric current out of the resistor again.

Furthermore, the resistor according to the invention also comprises a resistor element which consists of a low-resistance resistor material (e.g. Manganin®), the resistor element being arranged between the first connection part and the second connection part with respect to the main current flow direction in the resistor, so that the electric current flows through the resistor element in operation.

Furthermore, the resistor according to the invention comprises a first pair of voltage measuring contacts with a voltage-side voltage measuring contact for potential measurement at the first connection part on the one hand and with a ground-side voltage measuring contact for potential measurement at the second connection part on the other hand.

Furthermore, the resistor according to the invention, in accordance with the known current-sensing resistor described at the beginning, also comprises a second pair of voltage measuring contacts with a voltage-side voltage measuring contact for potential measurement at the first connection part on the one hand and a ground-side voltage measuring contact for potential measurement at the second connection part on the other hand.

In the known current-sensing resistor described at the beginning according to WO 2014/161624 A1, the pairs of voltage measuring contacts are arranged in such a way that no crossover measurement takes place, i.e. the connection lines between the voltage measuring contacts of the pairs run parallel to each other. However, with the known current-sensing resistor, this has the consequence that the temperature dependence of the measurement is not optimal.

In contrast, the invention now provides that the two pairs of voltage measuring contacts are arranged crosswise so that in a top view of the resistor, the connection line of the two voltage measuring contacts of the first pair of voltage measuring contacts intersects the connection line of the two voltage measuring contacts of the second pair of voltage measuring contacts. Thus, the invention provides for crossover measurement at the different pairs of voltage measuring contacts.

It should further be noted that the invention is not limited to a resistor having only two pairs of voltage sensing contacts. Rather, it is also possible within the scope of the invention that a larger number of pairs of voltage measuring contacts are provided, as is also the case with the known current-sensing resistor according to WO 2014/161624 A1 described at the beginning. The only important thing here is that the individual pairs of voltage measuring contacts cross with their connection lines, as already described above.

In a preferred embodiment of the invention, there is a cut in each of the two connection parts, as is known per se from the prior art, whereby such cuts are also referred to as current shadows and serve to positively influence the electric field distribution in the current-sensing resistor. The two cuts in the opposite connection parts can have the same distance to the resistor element along the main current flow direction in the resistor, but this is not absolutely necessary.

Furthermore, it should be mentioned that the two cuts are preferably arranged on the same side of the resistor and thus start from the same side edge of the resistor. Here, it is possible that the two cuts extend transversely to the main current flow direction in the resistor over at least part of their length to form a current shadow, as mentioned above. For example, the two cuts may extend towards the centre to a depth where the voltage measuring contacts are also located. This is useful so that the cuts, which serve as current shadows, shield the voltage measuring contacts accordingly.

Furthermore, it should be mentioned that the two cuts can have the same depth starting from the side edge of the resistor. Alternatively, it is also possible that the two cuts in the two connection parts have a different depth and thus extend to the centre axis of the resistor to a different extent.

The aforementioned voltage measuring contacts are preferably arranged between the resistor element and the respective cut with respect to the main current flow direction.

Furthermore, it is possible within the scope of the invention that the two connection parts preferably have the same width transverse to the main current flow direction. The resistor according to the invention can thus be rectangular in a top view. Alternatively, however, it is also possible for the two connection parts to have a different width transversely to the main flow direction of the stocking. Thus, the resistor according to the invention can also be L-shaped in a top view.

Furthermore, it should be mentioned that the resistor according to the invention preferably has a continuous, straight side edge without kinks on the side with the cuts. On the side opposite the cuts, on the other hand, the resistor may have a side edge with at least one kink. This kink can be located, for example, in the first connection part, which is used to introduce the electrical current into the resistor. The width of the first connection part upstream of the kink is then preferably greater than the width of the first connection part downstream of the kink.

It has already been briefly mentioned above that the resistor according to the invention can be L-shaped in a top view. In this case, it is advantageous if the depth of the cut in the wider connection part is smaller than the depth of the cut in the narrower connection part, since this positively influences the electric field distribution in the resistor.

The invention enables—as already briefly mentioned above—an improvement of the temperature behaviour of the resistor. It should be mentioned here that the resistor according to the invention between the two voltage measuring contacts of the first pair has a temperature-dependent first resistance value, while the resistor between the two voltage measuring contacts of the second pair has a temperature-dependent second resistance value. The crossover measurement according to the invention now allows these two resistance values to be substantially the same regardless of temperature, with a difference of less than ±20%, ±10%, ±5%, ±2% or ±1% within the entire temperature range of −70° C. to +170° C., −40° C. to +140° C., −10° C. to +110° C., or at least within the entire temperature range of +20° C. to +80° C.

It has already been briefly mentioned above that the conductor material of the connection parts can be copper. However, there is also the alternative possibility that the conductor material of the connection parts is a copper alloy, aluminium or an aluminium alloy.

There are also various possibilities within the scope of the invention with regard to the resistor material of the resistor element. For example, the resistor material may be a copper alloy, in particular a copper-manganese-nickel alloy. Examples are the resistor alloys Manganin® (CuMn12Ni), Zeranin® (CuMn7Sn) or Noventin® (CuMnNi 25-10). Alternatively, it is possible that the resistor material is a nickel-chromium alloy, such as Isaohm® (NiCr20Alsi). It is also possible that the resistor material is an iron-chromium alloy, such as AluChrom® (Fe70/Cr25/Al5).

In the preferred embodiment of the invention, the resistor element is electrically and mechanically connected to the two connection parts, for example by a welded connection, whereby electron beam welding is particularly suitable, as is known for example from EP 0 605 800 A1.

Furthermore, it should be mentioned that the connection parts are preferably arranged on opposite sides of the resistor element. However, it is alternatively also possible that the connection parts are arranged on the same side of the resistor element, so that introduction and discharge of the current take place on the same side of the resistor element.

Furthermore, it should be noted that the connection parts and the resistor element are preferably plate-shaped, whereby the plate-shaped parts may optionally be flat or curved.

In general, it should be noted that the resistor material of the resistor element has a greater electrical resistivity than the conductive material of the connection parts. For example, the resistor material of the resistor element may have a resistivity of less than 1000 µΩcm, 500 µΩcm, 250 µΩcm, 100 µΩcm or 50 µΩcm.

The conductor material of the connection parts, on the other hand, preferably has a specific electrical resistance of less than 20 µΩcm, 10 µΩcm, 5 µΩcm or 2 µΩcm.

The resistor as a whole, on the other hand, preferably has a resistance value that is less than 100Ω, 10Ω, 1Ω, 100 ml, 10 mΩ, 1 mΩ, 100µΩ, 10µΩ or 1µΩ.

In the two connection parts, there may be a current connection in each case in the resistor according to the invention, in order to introduce the current into the resistor or to lead it out of the resistor. For example, this current connection may comprise a hole in the respective connection part.

It should also be mentioned that the resistor can be optionally symmetrical or asymmetrical with respect to the main current flow direction.

The aforementioned voltage measuring contacts, on the other hand, are preferably arranged off-centre in the resistor with respect to the central axis of the resistor, for example in the lateral third or quarter of the resistor, in particular on the side of the cuts.

Above, the resistor according to the invention has been described as a single component. However, the invention also claims protection for a measuring arrangement comprising such a resistor for current measurement.

Furthermore, the measuring arrangement according to the invention comprises a voltage measuring device comprising two voltage measuring channels for measuring the voltage at the two pairs of voltage measuring contacts separately in the two voltage measuring channels.

Furthermore, the measuring arrangement according to the invention preferably comprises a computing unit for evaluating the voltage measurement values in the two voltage measurement channels. In one variant of the invention, the computing unit calculates an average value from the two voltage measurement values and then calculates the current flowing through the resistor from this average value. In another variant of the invention, on the other hand, a corresponding measured current value is calculated from the two measured voltage values in each case in accordance with Ohm's law, as is known per se from the prior art.

Other advantageous further embodiments of the invention are indicated in the dependent claims or are explained in more detail below together with the description of the preferred embodiments of the invention with reference to the figures.

DETAILED DESCRIPTION OF THE DRAWINGS

Figure 1A:
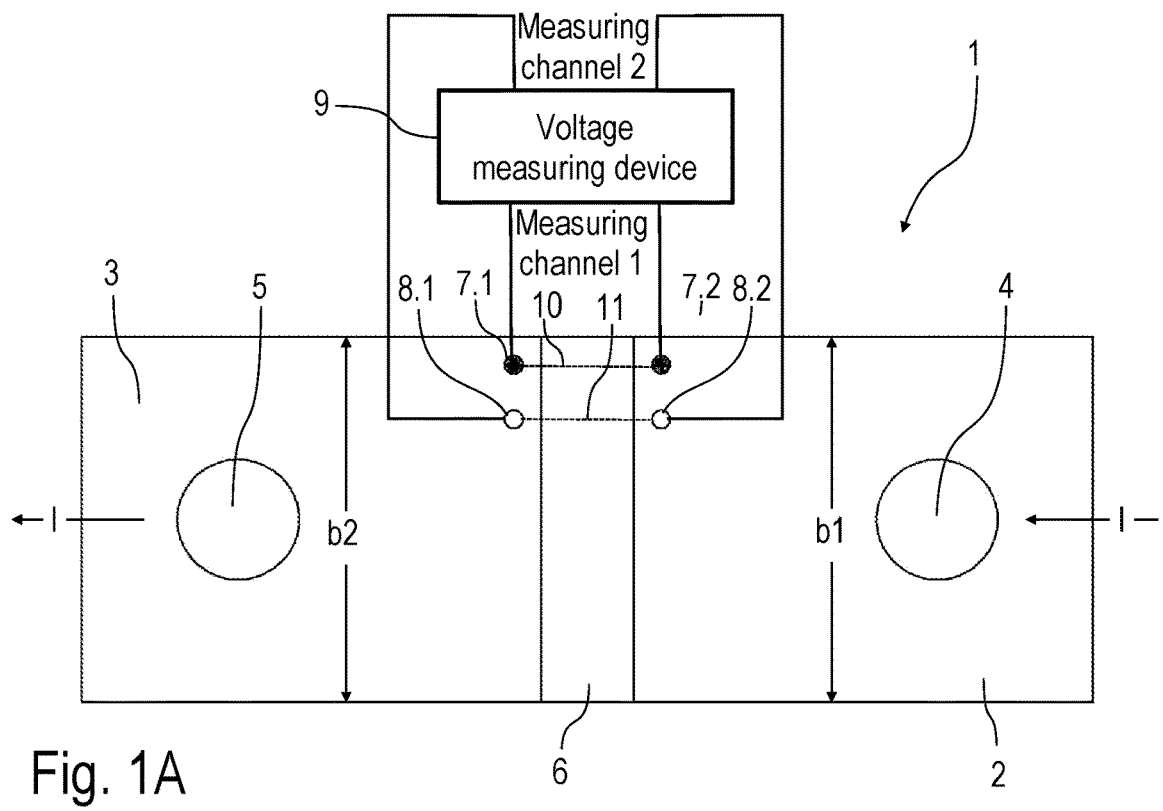
FIG. 1A shows a conventional current-sensing resistor according to the state of the art with a corresponding measuring arrangement.

In the following, we will first describe the drawing according to FIG. 1A, which shows a conventional current-sensing resistor 1 according to the state of the art.

First of all, the conventional current-sensing resistor 1 has a plate-shaped connection part 2 made of copper, which is used to introduce an electric current I to be measured into the current-sensing resistor 1.

Furthermore, the current-sensing resistor 1 has a plate-shaped connection part 3 made of copper, which is used to lead the electric current I out of the current-sensing resistor 1 again.

For this purpose, the two plate-shaped connection parts 2, 3 each have a hole 4 or 5 to which, for example, a screw can be connected, as is known per se from the state of the art.

In the embodiment example shown, the two connection parts 2, 3 have the same width b1 or b2 at right angles to the direction of current flow.

Between the two connection parts 2, 3 there is a likewise plate-shaped resistor element 6 made of a resistor material (e.g. Manganin®), whereby the resistor element 6 is connected at its edges to the adjacent connection parts 2, 3 by electron beam welding. The electric current I to be measured is thus introduced into the current-sensing resistor 1 via the connection part 2, then flows through the resistor element 6 and is then discharged again from the current-sensing resistor 1 via the other connection part 3.\

Furthermore, the current-sensing resistor has two pairs of voltage measuring contacts 7.1, 7.2 and 8.1, 8.2, respectively, to measure the electric voltage dropping across the resistor element 6, which, according to Ohm's law, forms a measure of the electric current I flowing through the current-sensing resistor 1.

Furthermore, the drawing shows a voltage measuring device 9 with two voltage measuring channels, wherein the first voltage measuring channel of the voltage measuring device 9 is connected to the two voltage measuring contacts 7.1, 7.2 of the first pair, while the second voltage measuring channel of the voltage measuring device 9 is connected to the two voltage measuring contacts 8.1, 8.2 of the second pair. The voltage measuring device 9 can thus measure the two voltage measurement values separately from each other.

It should be mentioned here that the two pairs of voltage measuring contacts 7.1, 7.2 or 8.1, 8.2 are not arranged crosswise, but are each arranged next to each other parallel to the main current flow direction in the current-sensing resistor 1. The drawing shows a connection line 10 between the voltage measuring contacts 7.1, 7.2 of the first voltage measuring channel and another connection line 11 between the two voltage measuring contacts 8.1, 8.2 of the second voltage measuring channel. The two connection lines 10, 11 run exactly parallel to each other.

Figure 1B:
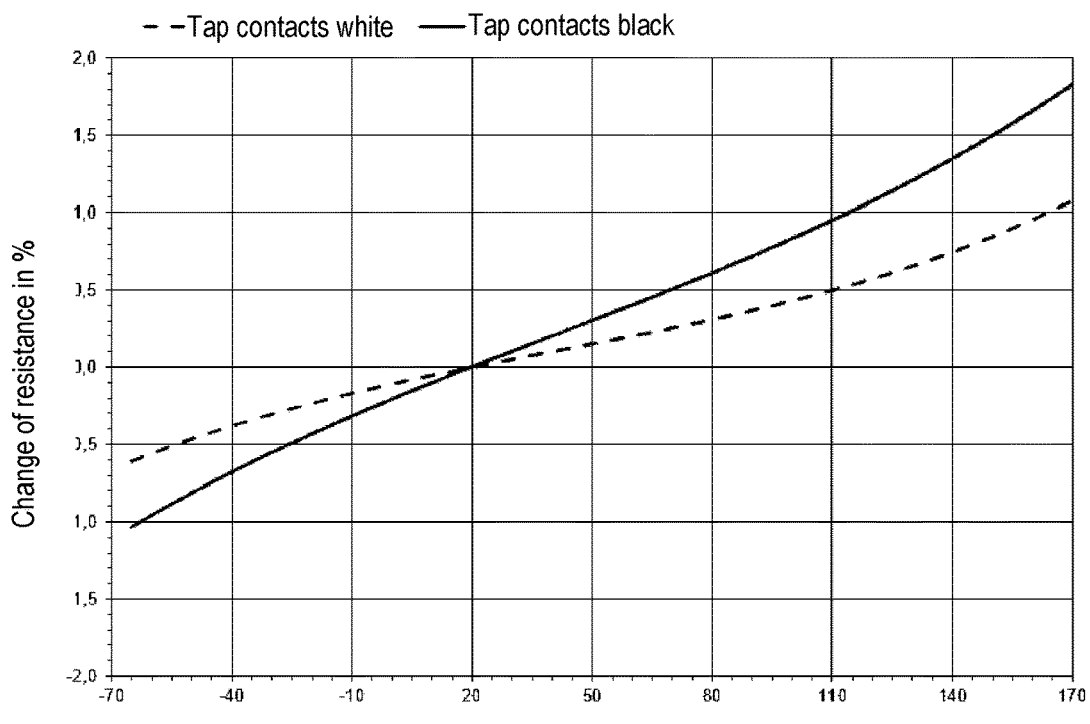
FIG. 1B shows the variation of the relative resistance of the current-sensing resistor according to FIG. 1A as a function of temperature.

With this arrangement of the voltage measuring contacts 7.1, 7.2, 8.1, 8.2, the current-sensing resistor 1 has a relatively large temperature dependence, as can be seen in FIG. 1B. The solid line shows the relative change in resistance as a function of temperature between the two voltage measuring contacts 7.1, 7.2 of the first measuring channel. The dashed line, on the other hand, shows the relative change in resistance as a function of temperature between the two voltage measuring contacts 8.1, 8.2 of the second measuring channel.

Figure 2A:
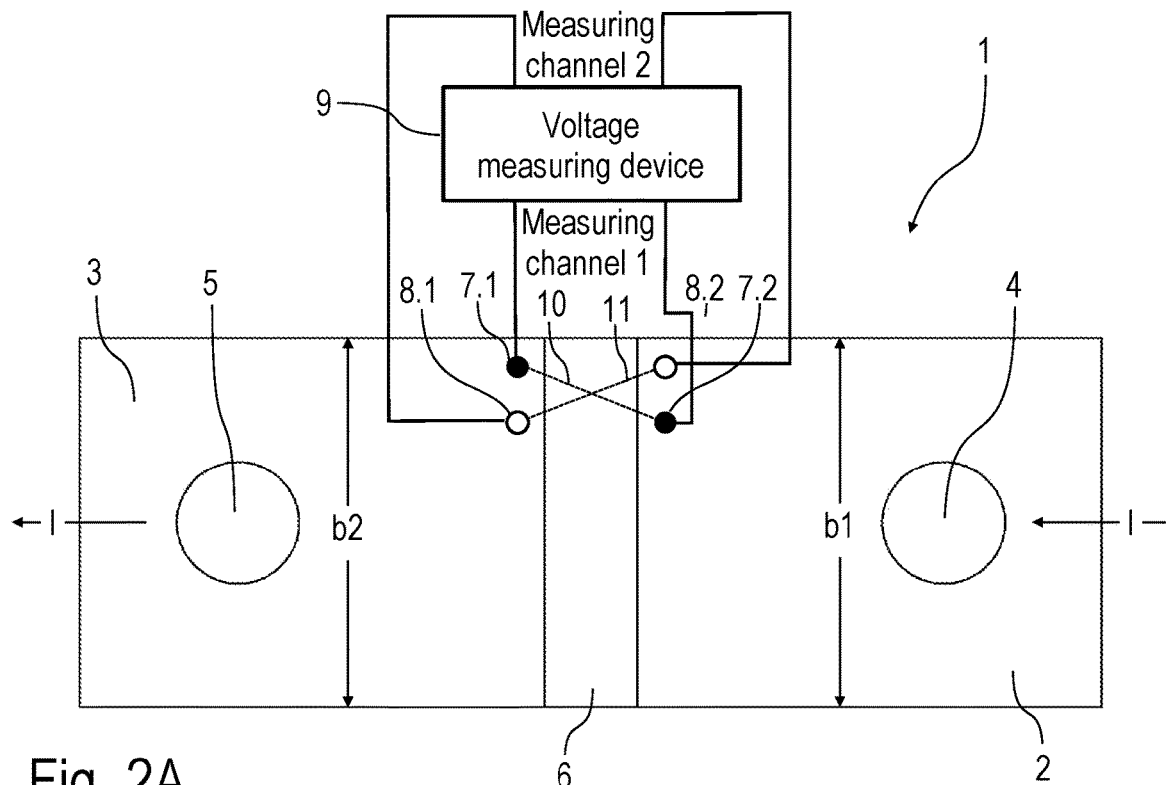
FIG. 2A shows a current-sensing resistor according to the invention as a component of a corresponding measuring arrangement.
Figure 2B:
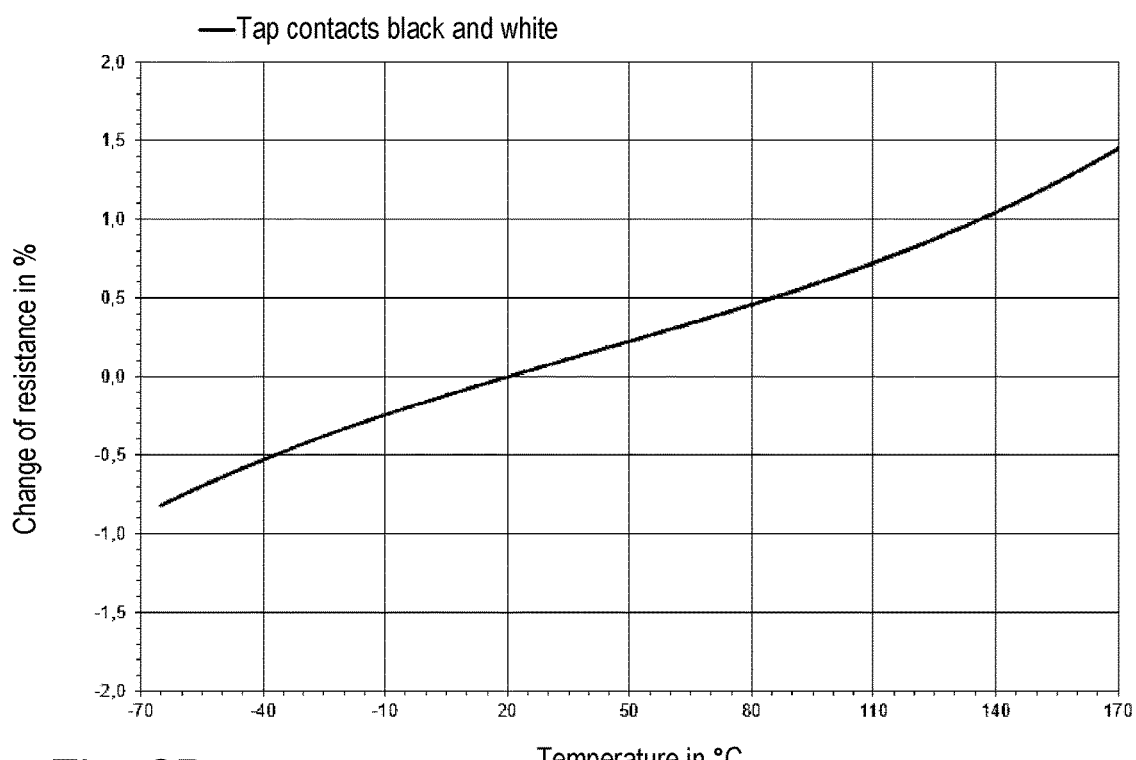
FIG. 2B shows the relative change in resistance as a function of temperature for the current-sensing resistor according to FIG. 2A.

FIGS. 2A and 2B show corresponding embodiments for a current-sensing resistor 1 according to the invention, whereby these embodiments largely correspond to the embodiment described above according to FIGS. 1A and 1B, respectively, so that in order to avoid repetition, reference is made to the above description, whereby the same reference signs are used for corresponding details.

A special feature of this embodiment according to the invention is that in a top view, the two connection lines 10, 11 between the voltage measuring contacts 7.1, 7.2 on the one hand and between the voltage measuring contacts 8.1, 8.2 on the other hand cross. As a result, the temperature dependence of the resistance value is the same for the two pairs of voltage measuring contacts 7.1, 7.2 and 8.1, 8.2 respectively, as can be seen in FIG. 2B.

Figure 3A:
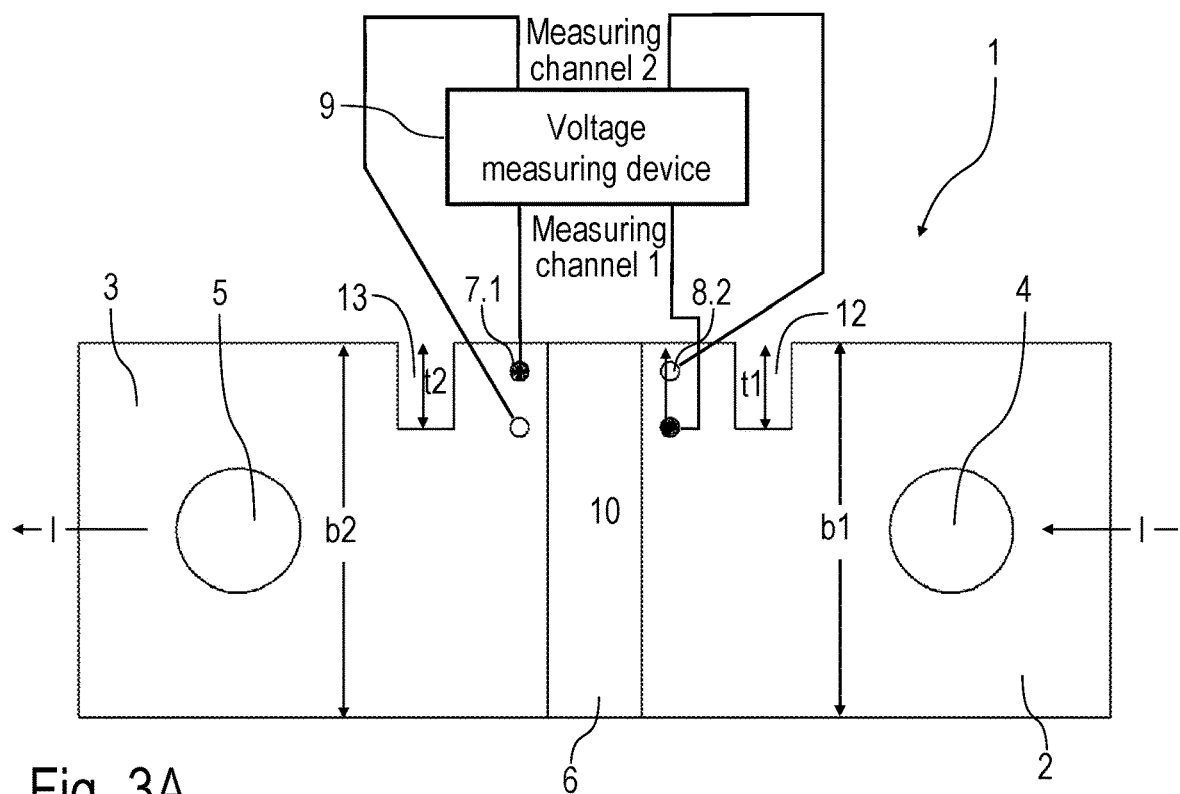
FIG. 3A shows a variation of the current-sensing resistor according to FIG. 2A with two lateral cuts (current shadows).

FIGS. 3A and 3B again show a modification on the previous figures, so that to avoid repetition, reference is made to the previous description, with the same reference signs being used for corresponding details.

A special feature here is that the current-sensing resistor 1 has a cut 12 or 13 in each of the two connection parts 2, 3, which is also referred to as a current shadow and positively influences the electric field distribution in the current-sensing resistor one.

The two cuts 12, 13 each start from the same side edge of the current-sensing resistor 1 and extend at right angles to the main direction of current flow in the current-sensing resistor 1 to a depth t1 or t2, the two depths t1, t2 being equal in this design example.

The voltage measuring contacts 7.1, 8.1 are located between the resistor element 6 and the cut 13 with respect to the main current flow direction in the current-sensing resistor 1.

The other voltage measuring contacts 7.2, 8.2, on the other hand, are located between the resistor element 6 and the other cut 12 with respect to the main current flow direction in the current-sensing resistor 1.

Figure 3B:
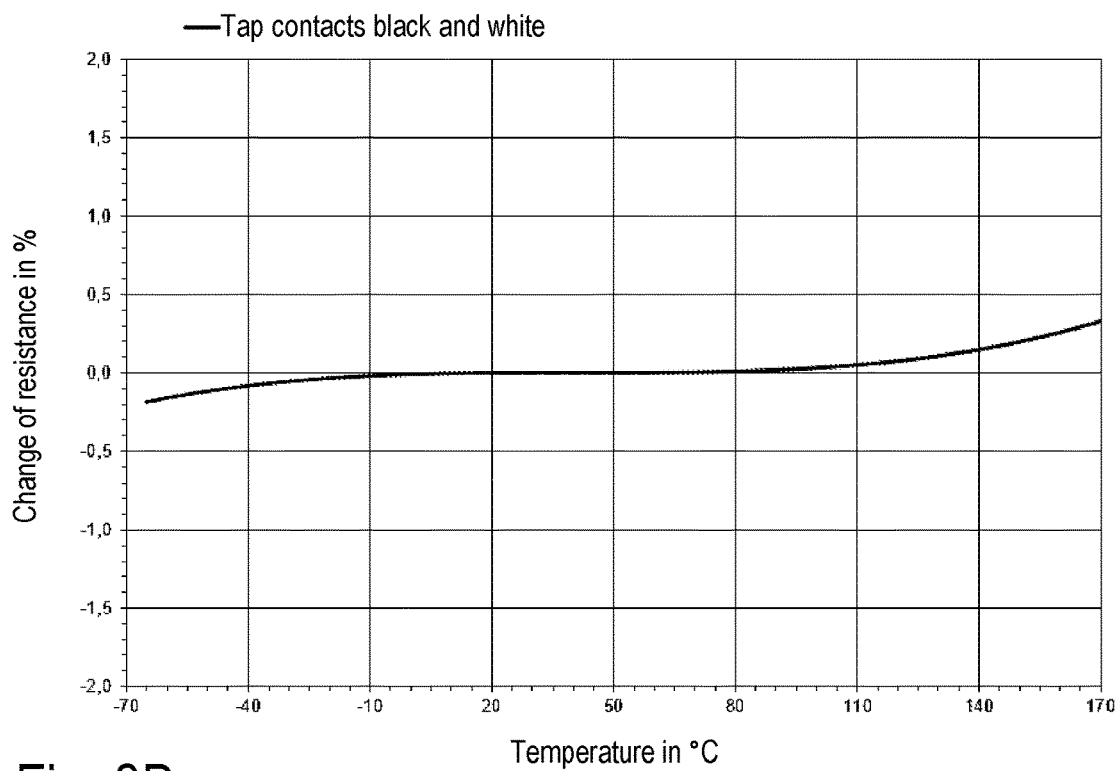
FIG. 3B again shows the course of the relative change in resistance for the current-sensing resistor according to FIG. 3A as a function of temperature.

The cuts 12, 13 reduce the temperature dependence of the measurement, as can be seen directly from a comparison of FIG. 3B with FIG. 2B.

Figure 4A:
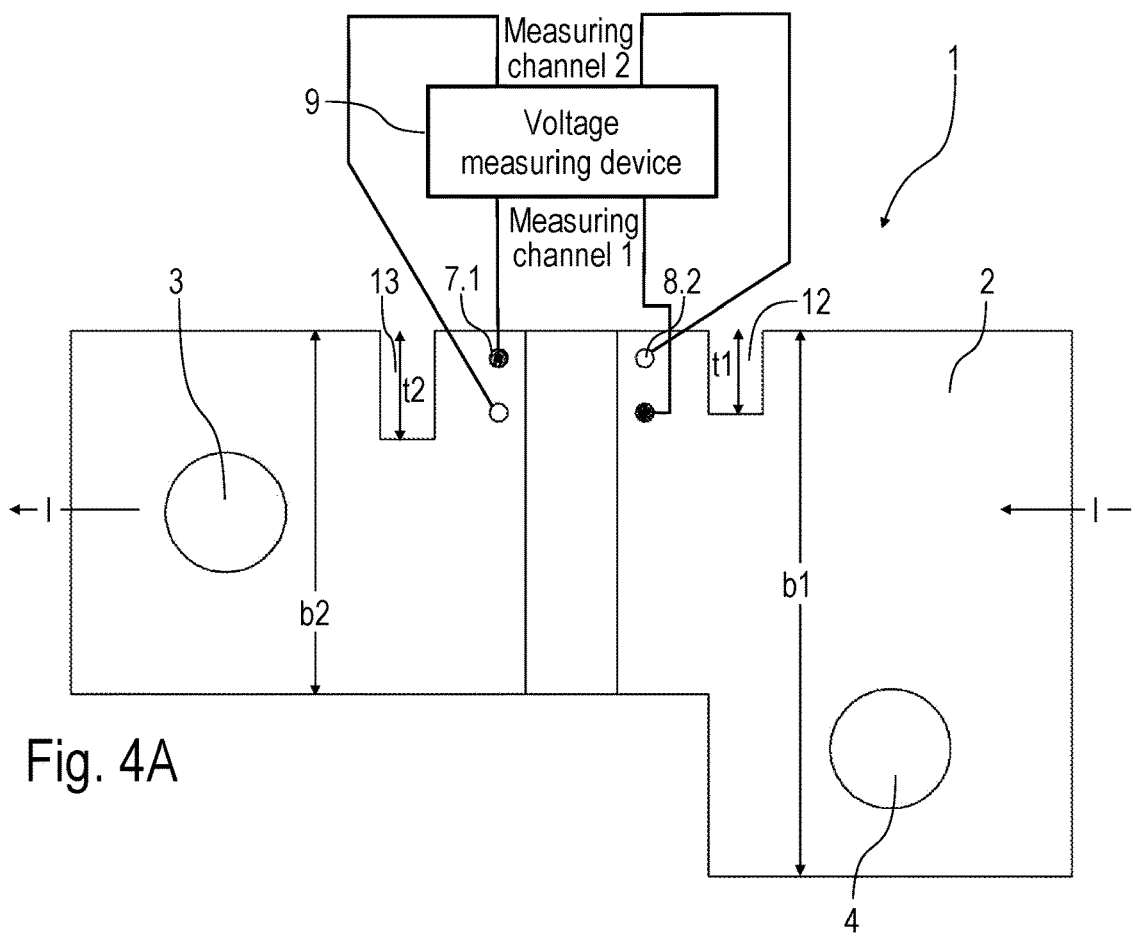
FIG. 4A shows a variation of FIG. 3A with an L-shaped current-sensing resistor.
Figure 4B:
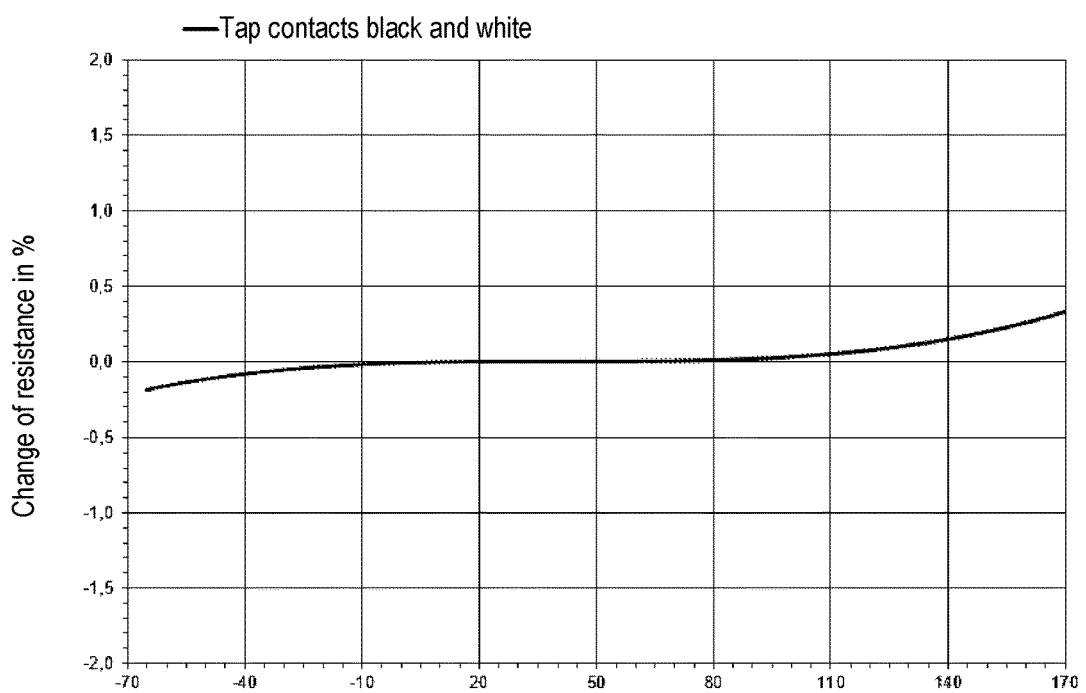
FIG. 4B shows the variation of the relative resistance change as a function of temperature for the current-sensing resistor according to FIG. 4A.

FIGS. 4A and 4B show a further modification of the current-sensing resistor 1 described above, so that in order to avoid repetition, reference is again made to the above description, with the same reference signs being used for corresponding details.

A special feature of the current-sensing resistor 1 in this embodiment example is that the current-sensing resistor 1 is L-shaped in plan view. This means that the width b1 at the connection part 2 is substantially larger than the width b2 at the other connection part 3.

In addition, the depth t1 of the cut 12 is significantly smaller than the depth t2 of the other cut 13.

Figure 4C:
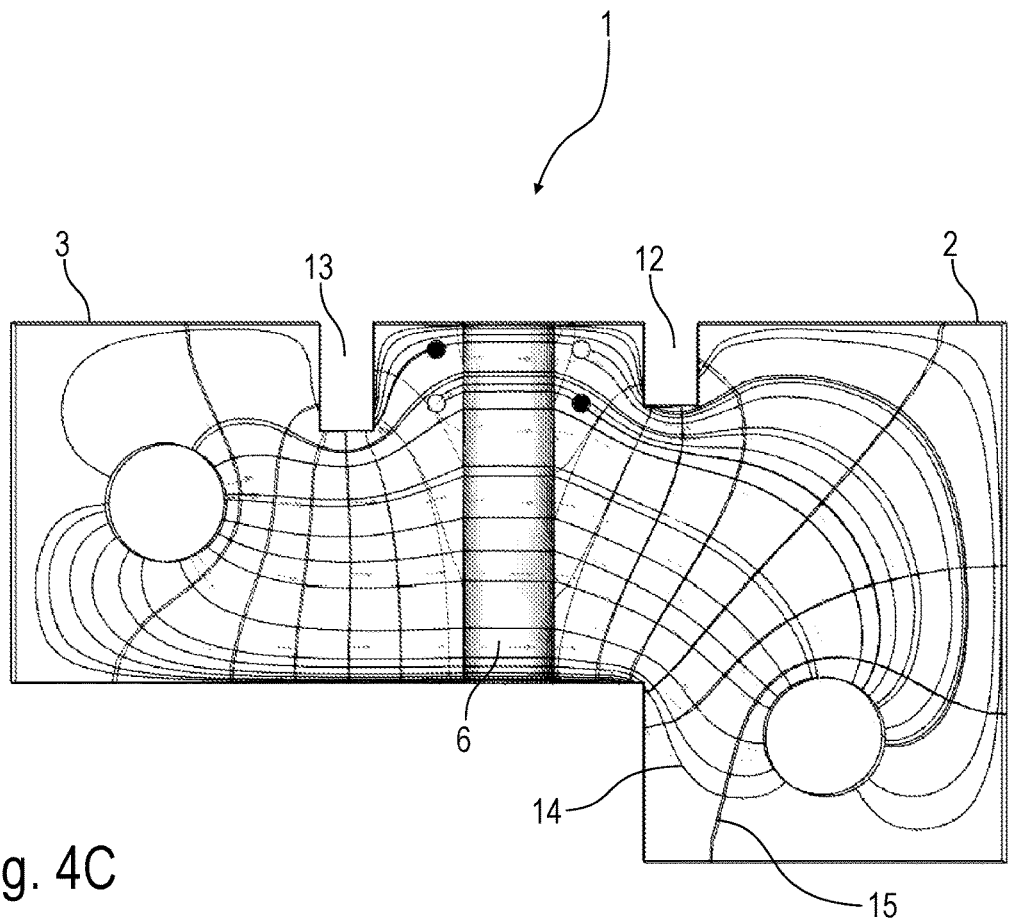
FIG. 4C shows the field curve and the equipotential lines in the current-sensing resistor according to FIG. 4A.

FIG. 4C shows the course of electric field lines 14 and equipotential lines 15 in the current-sensing resistor 1 according to FIG. 4A.

Figure 5:
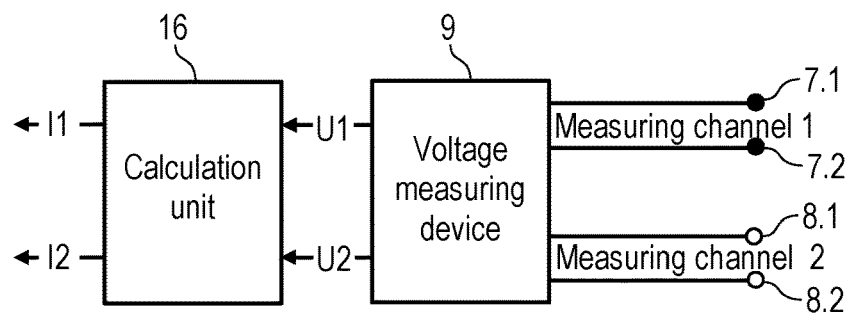
FIG. 5 shows a schematic diagram of a measuring arrangement according to the invention.

FIG. 5 shows a schematic representation of a measuring arrangement according to the invention with the voltage measuring device 9 for voltage measurement via the two measuring channels. In this case, the voltage measuring device 9 generates two measured voltage values U1, U2, which are output separately from one another to a computing unit 16. The computing unit 16 then calculates two current measurement values I1, I2 for the electric current I flowing through the current measurement resistor 1 in accordance with Ohm's law.

Figure 6:
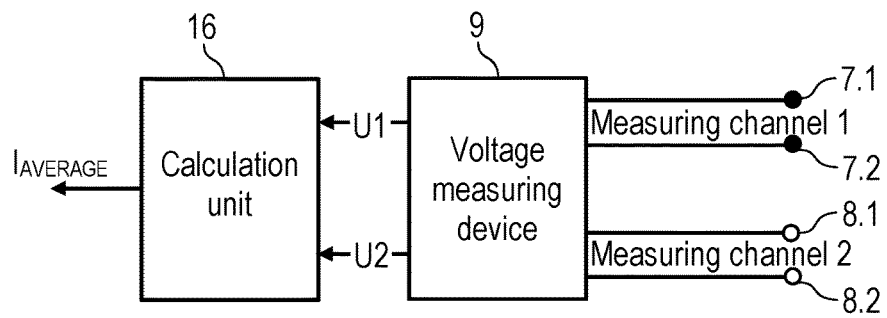
FIG. 6 shows a modification of FIG. 5.

In the modified example shown in FIG. 6, the computing unit 16 calculates an average value from the two measured voltage values U1, U2 and then outputs an averaged current value $I_{AVERAGE}$.

The invention is not limited to the preferred embodiments described above. Rather, the invention also claims protection for the subject-matter and the features of the sub-claims independently of the respective claims referred to. The invention thus comprises various aspects of the invention which enjoy protection independently of one another.

The invention claimed is:

1. A current-sensing resistor, comprising:
a first connection part made of an electrically conductive conductor material for introducing an electric current into the resistor;
a second connection part made of an electrically conductive conductor material for conducting the electric current out of the resistor;
a resistor element made of a low-resistance resistor material, said resistor element being arranged between said first connection part and said second connection part with respect to a main current flow direction and being traversed by said electric current during operation;
a first pair of voltage measuring contacts with a voltage measuring contact on a voltage-side for potential measurement at the first connection part on the one hand and a voltage measuring contact on a ground-side for potential measurement at the second connection part on the other hand; and
a second pair of voltage measuring contacts with a voltage-side voltage measuring contact for potential measurement at the first connection part on the one hand and a ground-side voltage measuring contact for potential measurement at the second connection part on the other hand,
wherein the two pairs of voltage measuring contacts are arranged crosswise so that a connection line of the two voltage measuring contacts of the first pair of voltage measuring contacts intersects with a connection line of the two voltage measuring contacts of the second pair of voltage measuring contacts in a top view of the resistor.

2. The current-sensing resistor according to claim 1, further comprising:
a lateral first cut in the first connection part; and
a lateral second cut in the second connection part.

3. The current-sensing resistor according to claim 2, wherein the two cuts have the same distance to the resistor element.

4. The current-sensing resistor according to claim 2, wherein the two cuts are arranged on the same side of the resistor and extend from a side edge of the resistor; and
the two cuts extend transversely to the main current flow direction in the resistor over at least part of their length to form a current shadow.

5. The current-sensing resistor according to claim 4, wherein the two cuts extend towards the centre up to a depth at which the voltage measuring contacts are located.

6. The current-sensing resistor according to claim 4, wherein:
the resistor comprises, on the side with the cuts, a continuous straight side edge without kinks, and
the resistor comprises a side edge with at least one kink on the side opposite the cuts.

7. The current-sensing resistor according to claim 6, wherein the kink is located in the first connection part, so that the width of the first connection part upstream of the kink is greater than the width downstream of the kink.

8. The current-sensing resistor according to claim 2, wherein the two cuts have a different depth transverse to the main current flow direction in the resistor.

9. The current-sensing resistor according to claim 2, wherein:
the voltage-side voltage-measuring contacts of the two pairs of voltage-measuring contacts are arranged with respect to the main current flow direction in the first connection part between the resistor element and the first cut, and
the ground-side voltage measuring contacts of the two pairs of voltage measuring contacts are arranged with respect to the main current flow direction in the second connection part between the resistor element and the second cut.

10. The current-sensing resistor according to claim 1, wherein the two connection parts have a different width transverse to the main current flow direction.

11. The current-sensing resistor according to claim 10, wherein a depth of a cut in a wider connection part of the two connection parts is smaller than a depth of a cut in a narrower connection part of the two connection parts.

12. The current-sensing resistor according to claim 1, wherein:
the resistor between the two voltage measuring contacts of the first pair has a temperature-dependent first resistance value,
the resistor between the two voltage measuring contacts of the second pair has a temperature-dependent second resistance value,
the two resistance values are the same irrespective of a temperature, in the entire temperature range from +20° to +80°, with a difference of less than ±20%.

13. The current-sensing resistor according to claim 1, wherein:
the conductor material of the connection parts is selected from a group consisting of copper, a copper alloy, aluminium and an aluminium alloy, and
the resistor material of the resistor element is a copper alloy.

14. The current-sensing resistor according to claim 1, wherein the resistor material of the resistor element is a nickel-chromium alloy.

15. The current-sensing resistor according to claim 1, wherein the resistor material of the resistor element is an iron-chromium alloy.

16. The current-sensing resistor according to claim 1, wherein the resistor material of the resistor element is electrically and mechanically connected to the two connection parts.

17. The current-sensing resistor according to claim 1, wherein:
- the two connection parts are arranged on opposite sides of the resistor element,
- the connection parts and the resistor element are plate-shaped,
- the resistor material of the resistor element has a greater specific electrical resistance than the conductor material of the connection parts,
- the resistor material of the resistor element has a specific electrical resistance of less than 1000 μΩcm,
- the conductor material of the connection parts has a specific electrical resistance of less than 20 μΩcm, and
- the resistor as a whole has a resistance value which is less than 100 Ω.

18. The current-sensing resistor according to claim 1, wherein the voltage measuring contacts in the resistor are arranged off-centre with respect to the main current flow direction.

19. A measuring system for current measurement, comprising:
- a current-sensing resistor including:
  - a first connection part made of an electrically conductive conductor material for introducing an electric current into the resistor;
  - a second connection part made of an electrically conductive conductor material for conducting the electric current out of the resistor;
  - a resistor element made of a low-resistance resistor material, said resistor element being arranged between said first connection part and said second connection part with respect to a main current flow direction and being traversed by said electric current during operation;
  - a first pair of voltage measuring contacts with a voltage measuring contact on a voltage-side for potential measurement at the first connection part on the one hand and a voltage measuring contact on a ground-side for potential measurement at the second connection part on the other hand; and
  - a second pair of voltage measuring contacts with a voltage-side voltage measuring contact for potential measurement at the first connection part on the one hand and a ground-side voltage measuring contact for potential measurement at the second connection part on the other hand,
  - wherein the two pairs of voltage measuring contacts are arranged crosswise so that a connection line of the two voltage measuring contacts of the first pair of voltage measuring contacts intersects with a connection line of the two voltage measuring contacts of the second pair of voltage measuring contacts in a top view of the resistor; and
- a voltage measuring device including:
  - a first voltage measuring channel for measuring a voltage at the first pair of voltage measuring contacts of the current-sensing resistor, and
  - a second voltage measuring channel for measuring a voltage at the second pair of voltage measuring contacts of the current-sensing resistor.

20. The measuring system according to claim 19, further comprising:
a computing unit which is adapted to calculate two current measurement values from the voltage measurement values measured in the two measurement channels in accordance with Ohm's law, which in each case represent the current flowing through the current-sensing resistor, the two current measurement values being redundant.

21. The measuring system according to claim 19, further comprising:
a computing unit which is adapted to calculate an averaged current measurement value from the voltage measurement values measured in the two measurement channels according to Ohm's law, which represents the current flowing through the current-sensing resistor.

* * * * *